(12) United States Patent
Chia

(10) Patent No.: US 8,999,759 B2
(45) Date of Patent: Apr. 7, 2015

(54) METHOD FOR FABRICATING PACKAGING STRUCTURE HAVING EMBEDDED SEMICONDUCTOR ELEMENT

(71) Applicant: Unimicron Technology Corporation, Taoyuan (TW)

(72) Inventor: Kan-Jung Chia, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 138 days.

(21) Appl. No.: 13/900,885

(22) Filed: May 23, 2013

(65) Prior Publication Data

US 2013/0252380 A1  Sep. 26, 2013

Related U.S. Application Data

(62) Division of application No. 12/876,674, filed on Sep. 7, 2010, now Pat. No. 8,461,689.

(30) Foreign Application Priority Data

Sep. 8, 2009 (TW) ................. 98130171 A

(51) Int. Cl.
*H01L 21/00* (2006.01)
*H01L 23/02* (2006.01)
(Continued)

(52) U.S. Cl.
CPC ............ *H01L 21/50* (2013.01); *H01L 23/5389* (2013.01); *H01L 24/24* (2013.01);
(Continued)

(58) Field of Classification Search
USPC ............ 257/E23.01, 690, E21.505, 700, 698, 257/778, 686, 723, E23.02, E23.023, 257/E23.031, 434, 680, 774, 777, E21.001, 257/E21.499, E21.577, E23.178, E23.182, 257/678, 679, 687, 703, 738, 780, 783, 257/E21.192, E21.5, E21.503, E21.507, 257/E21.511, E21.575, E21.584, E21.599, 257/E23.001, E23.002, E23.003, E23.006, 257/E23.063, E23.064, E23.068, E23.069, 257/E23.085, E23.127, E23.145, E23.16, 257/E23.169, E23.176, E23.192, E23.194, 257/E25.023, E27.137, E31.11, 178, 432, 257/433, 444, 620, 633, 660, 676, 684, 685, 257/692, 693, 699, 705, 732, 734, 737, 747, 257/753, 758, 773; 438/121, 118, 107, 125, 438/64, 105, 106, 109, 110, 111, 113, 119, 438/124, 16, 406, 675; 361/761, 783; 174/255

See application file for complete search history.

(56) References Cited

U.S. PATENT DOCUMENTS 7,656,040 B2  2/2010  Hsu et al.
7,719,104 B2  5/2010  Hsu et al.
(Continued)

FOREIGN PATENT DOCUMENTS

TW  200803677  1/2008
TW  201014480  4/2010

*Primary Examiner* — Julio J Maldonado
*Assistant Examiner* — Cory Eskridge
(74) *Attorney, Agent, or Firm* — Mintz Levin Cohn Ferris Glovsky and Popeo, P.C.; Peter F. Corless; Steven M. Jensen

(57) ABSTRACT

A method for fabricating a packaging structure having an embedded semiconductor element includes: providing a substrate having opposite first and second surfaces and at least an opening penetrating the first and second surfaces; forming a first metallic frame around the periphery of the opening on the first surface; forming at least an opening inside the first metallic frame by laser ablation; disposing a semiconductor chip in the opening; forming a first dielectric layer on the first and second surfaces and the chip; forming a first wiring layer on the first dielectric layer of the first surface; and forming a first built-up structure on the first dielectric layer and the first wiring layer of the first surface. A shape of the opening is precisely controlled through the first metallic frame around the periphery of the predefined opening region, thereby allowing the chip to be precisely embedded in the substrate.

11 Claims, 3 Drawing Sheets

(51) Int. Cl.
*H01L 21/50* (2006.01)
*H01L 23/538* (2006.01)
*H01L 23/00* (2006.01)
*H05K 1/18* (2006.01)
H01L 23/31 (2006.01)
H01L 23/498 (2006.01)
H05K 3/00 (2006.01)

(52) U.S. Cl.
CPC ............... *H01L 24/82* (2013.01); *H05K 1/185* (2013.01); *H01L 23/3121* (2013.01); *H01L 23/49822* (2013.01); *H01L 23/49827* (2013.01); *H01L 2224/24227* (2013.01); *H01L 2924/01029* (2013.01); *H01L 2924/01082* (2013.01); *H01L 2924/14* (2013.01); *H05K 3/0032* (2013.01); *H05K 2201/0969* (2013.01); *H05K 2201/09781* (2013.01); *H05K 2201/10674* (2013.01); *H01L 2924/01033* (2013.01)

(56) References Cited

U.S. PATENT DOCUMENTS

| | | |
|---|---|---|
| 7,880,296 B2 | 2/2011 | Wong et al. |
| 7,973,398 B2 | 7/2011 | Hsu |
| 8,181,342 B2 | 5/2012 | Chiang et al. |
| 2006/0145328 A1* | 7/2006 | Hsu .............................. 257/690 |
| 2008/0150164 A1* | 6/2008 | Chia ............................. 257/783 |
| 2010/0078205 A1 | 4/2010 | Sakai et al. |
| 2011/0140286 A1 | 6/2011 | Machida |
| 2011/0164391 A1 | 7/2011 | Shin et al. |
| 2012/0081864 A1 | 4/2012 | Sakurai et al. |

\* cited by examiner

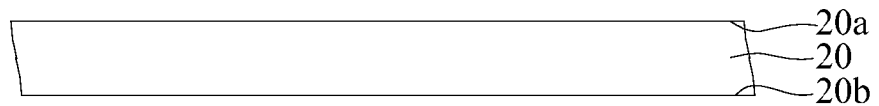
FIG. 2A
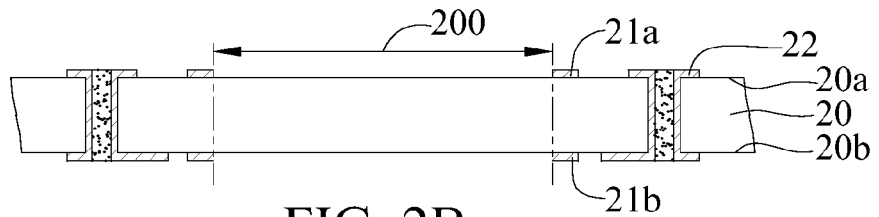
FIG. 2B
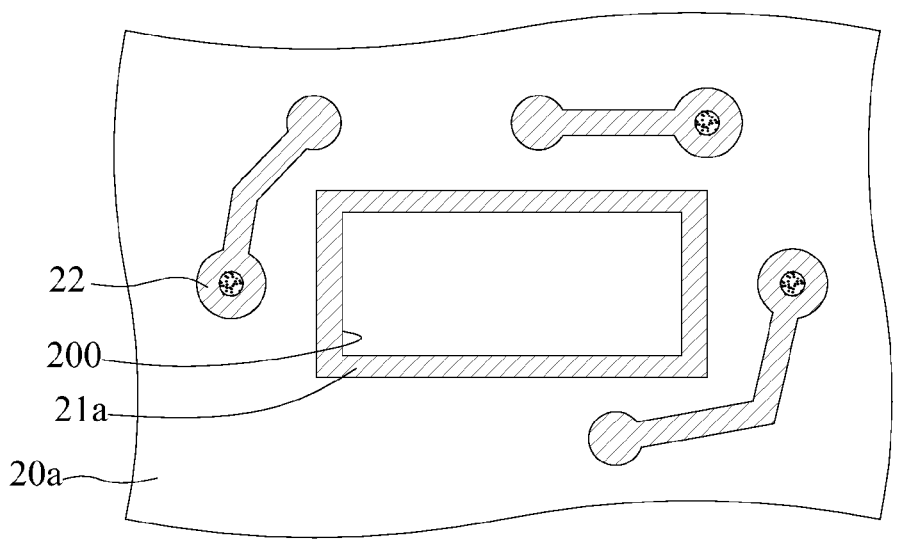
FIG. 2B'
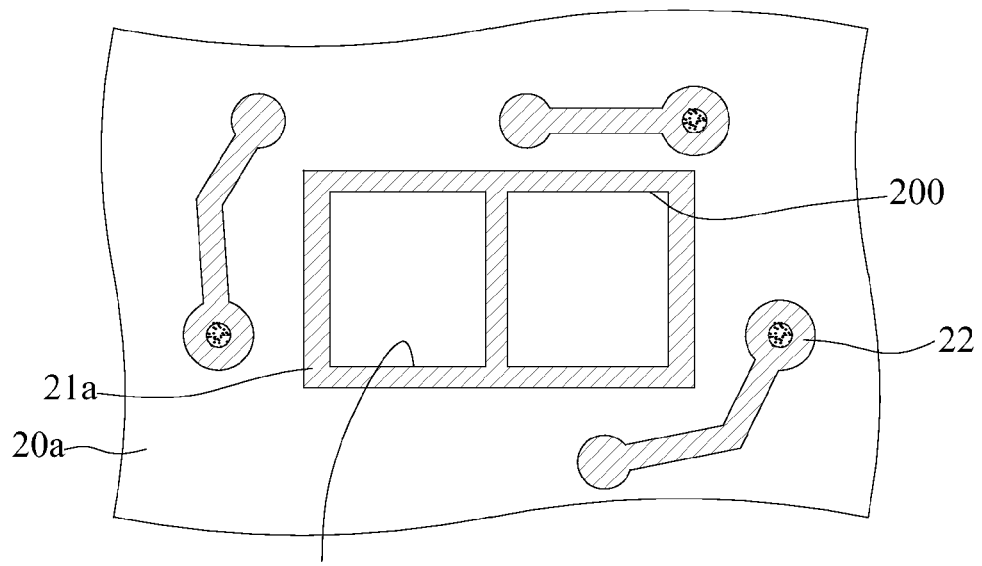
FIG. 2B"

METHOD FOR FABRICATING PACKAGING STRUCTURE HAVING EMBEDDED SEMICONDUCTOR ELEMENT

CROSS-REFERENCE TO RELATED APPLICATIONS

This application is a divisional of copending application U.S. Ser. No. 12/876,674, filed on Sep. 7, 2010, which claims under 35 U.S.C. §119(a) the benefit of Taiwanese Application No. 098130171, filed Sep. 8, 2009, the entire contents of which are incorporated herein by reference.

BACKGROUND OF THE INVENTION

1. Field of the Invention

The present invention relates generally to packaging structures and methods for fabricating the same, and more particularly, to a packaging structure with a semiconductor element precisely embedded therein and a method for fabricating the same.

2. Description of Related Art

Besides conventional wiring bonding and flip chip semiconductor packaging technologies, the electronic industry has developed different types of packages, for example, a package having a semiconductor IC chip embedded and electrically connected to a packaging substrate. Such a package has reduced size and improved electrical performance and therefore has become increasing popular.

FIGS. 1A to 1C' are cross-sectional views showing a conventional packaging structure having an embedded semiconductor element and a method for fabricating the same, wherein FIG. 1B' shows another embodiment of FIG. 1B, and FIG. 1C' shows the structure of FIG. 1B' after performing a sequence of subsequent processes thereon.

Referring to FIG. 1A, a substrate 10 is provided, which has a first surface 10a and an opposite second surface 10b and a predefined opening region 100 for embedding a semiconductor chip. The substrate 10 further has a plurality of conductive through holes 12 penetrating the first surface 10a and the second surface 10b.

Referring to FIG. 1B, a opening 100' is formed at the position of the predefined opening region 100 by laser ablation and penetrates the first surface 10a and the second surface 10b.

However, since the opening 100' is generally formed through continuous laser ablation, it can easily lead to an uneven surface of the opening 100' and makes it difficult to provide an accurate shape for the opening 100'. As such, the shape of the opening 100' deviates from the predefined opening region 100, which adversely affects precise positioning of the semiconductor chip in the opening 100'.

To overcome the drawback, referring to FIG. 1B', another predefined opening region 101 with larger size is provided and laser ablated so as to form a opening 101' penetrating the first surface 10a and the second surface 10b.

Further Referring to FIG. 1C', a semiconductor chip 13 is disposed in the opening 101'. The semiconductor chip 13 has an active surface 13a with a plurality of electrode pads 131 and an opposite inactive surface 13b, and the active surface 13a is exposed from the opening 100'. Further, a first dielectric layer 14 is formed in the gap between the opening 101' and the semiconductor chip 13, on the semiconductor chip 13, the first surface 10a and the second surface 10b. Then, a first wiring layer 141 is formed on the first dielectric layers 14 on the first surface 10a, and a plurality of first conductive vias 142 is formed in the first dielectric layer 14 to electrically connect the first wiring layer 141, the conductive through holes 12 and the electrode pads 131. Further, a second wiring layer 171 is formed on the first dielectric layers 14 on the second surface 10b, and a plurality of second conductive vias 172 are formed in the first dielectric layer 14 to electrically connect the second wiring layer 171 and the conductive through holes 12. Thereafter, a first built-up structure 15 is formed on the first dielectric layer 14 and the first wiring layer 141 of the first surface 10a, and a second built-up structure 18 is formed on the first dielectric layer 14 and the second wiring layer 171 of the second surface 10b.

However, the predefined opening region 101 with a larger size results in a large gap between the semiconductor chip 13 and the opening 101' and makes it quite difficult to fill the large gap with the first dielectric layer 14. Therefore, recesses can easily be formed on the surface of the first dielectric layer 14, and even short circuit or delamination may occur to the built-up wiring layers, thus decreasing reliability and yield of the entire structure.

Further, the semiconductor chip 13 can be secured in the opening by an adhesive material (not shown). However, the large gap needs a great amount of the adhesive material and the adhesive material is quite expensive, thereby complicating the process and increasing the fabrication cost.

Therefore, it is imperative to provide a packaging structure having an embedded semiconductor element and a method for fabricating the same so as to overcome the above drawbacks.

SUMMARY OF THE INVENTION

In view of the above drawbacks of the prior art, it is an object of the present invention to provide a packaging structure having an embedded semiconductor element and a method for fabricating the same so as to provide an accurate opening shape and increase product reliability.

In order to achieve the above and other objects, the present invention provides a packaging structure having an embedded semiconductor element, which comprises: a substrate having a first surface and an opposite second surface and at least an opening penetrating the first and second surfaces; a first metallic frame disposed around the periphery of the opening on the first surface of the substrate; a semiconductor chip disposed in the opening and having an active surface with a plurality of electrode pads and an opposite inactive surface; two first dielectric layers formed on the first surface of the substrate and the active surface of the semiconductor chip and on the second surface of the substrate and the inactive surface of the semiconductor chip, respectively; a first wiring layer formed on the first dielectric layer on the first surface of the substrate and the active surface of the semiconductor chip; and a first built-up structure disposed on the first dielectric layer and the first wiring layer of the first surface of the substrate.

The above-described packaging structure can further comprise a second metallic frame disposed around the periphery of the opening on the second surface of the substrate.

In the above-described packaging structure, the first dielectric layer can fill the gap between the opening and the semiconductor chip so as to secure the semiconductor chip in the opening.

The above-described packaging structure can further comprise at least a conductive through hole penetrating the first surface and the second surface of the substrate, and a plurality of first conductive vias formed in the first dielectric layer for electrically connecting the first wiring layer, the conductive through hole and the electrode pads.

In the above-described packaging structure, the first built-up structure can comprise at least a second dielectric layer, a second wiring layer formed on the second dielectric layer, and a plurality of second conductive vias formed in the second dielectric layer and electrically connecting the first wiring layer and the second wiring layer, wherein the outermost second wiring layer of the first built-up structure has a plurality of first conductive pads, a first insulation protective layer formed on the first built-up structure and a plurality of first openings formed therein for exposing the first conductive pads, respectively.

The above-described packaging structure can further comprise: two third wiring layers formed on the first dielectric layer on the second surface of the substrate and the inactive surface of the semiconductor chip, respectively, and a plurality of third conductive vias formed in the first dielectric layer and electrically connecting the third wiring layer and the conductive through hole. Further, a second built-up structure can be disposed on the first dielectric layer and the third wiring layer on the second surface of the substrate. The second built-up structure comprises at least a third dielectric layer, a fourth wiring layer formed on the third dielectric layer, and a plurality of fourth conductive vias formed in the third dielectric layer and electrically connecting the fourth wiring layer and the third wiring layer, wherein the outermost fourth wiring layer of the second built-up structure has a plurality of second conductive pads, a second insulation protective layer formed on the second built-up structure and a plurality of second openings formed therein for exposing the second conductive pads, respectively.

The above-described packaging structure can comprise a plurality of the openings and a corresponding plurality of the first metallic frames and semiconductor chips, wherein the first metallic frames are connected with each other and the semiconductor chips are received in the openings, respectively.

The present invention further provides a method for fabricating a packaging structure having an embedded semiconductor element, which comprises the steps of: providing a substrate having a first surface and an opposite second surface and at least an opening region predefined on the first surface; forming a first metallic frame around the periphery of the predefined opening region on the first surface of the substrate; forming an opening inside the first metallic frame by laser ablation, the opening being formed to penetrate the first surface and the second surface of the substrate; disposing a semiconductor chip in the opening, the semiconductor chip having an active surface with a plurality of electrode pads and an opposite inactive surface; respectively forming a first dielectric layer on the first surface of the substrate and the active surface of the semiconductor chip and on the second surface of the substrate and the inactive surface of the semiconductor chip; forming a first wiring layer on the first dielectric layer on the first surface of the substrate and the active surface of the semiconductor chip; and forming a first built-up structure on the first dielectric layer and the first wiring layer of the first surface of the substrate.

The method can further comprise forming a second metallic frame around the periphery of the predefined opening region on the second surface of the substrate.

In the above-described method, the first dielectric layer can fill the gap between the opening and the semiconductor chip so as to secure the semiconductor chip in the opening.

The above-described method further comprises forming at least a conductive through hole penetrating the first surface and the second surface, and forming a plurality of first conductive vias in the first dielectric layer for electrically connecting the first wiring layer, the conductive through hole and the electrode pads.

In the above-described method, the first built-up structure comprises at least a second dielectric layer, a second wiring layer formed on the second dielectric layer, and a plurality of second conductive vias formed in the second dielectric layer for electrically connecting the first wiring layer and the second wiring layer. Further, the outermost second wiring layer of the first built-up structure has a plurality of first conductive pads, a first insulation protective layer is formed on the first built-up structure, and a plurality of first openings are formed in the first insulation protective layer for exposing the first conductive pads, respectively.

The above-described method further comprises, forming a third wiring layer on the first dielectric layer on the second surface of the substrate and the inactive surface of the semiconductor chip, and forming a plurality of third conductive vias in the first dielectric layer for electrically connecting the third wiring layer and the conductive through hole. A second built-up structure can be further formed on the first dielectric layer and the third wiring layer on the second surface of the substrate. The second built-up structure comprises at least a third dielectric layer, a fourth wiring layer formed on the third dielectric layer, and a plurality of fourth conductive vias formed in the third dielectric layer for electrically connecting the fourth wiring layer and the third wiring layer. The outermost fourth wiring layer of the second built-up structure has a plurality of second conductive pads, a second insulation protective layer is formed on the second built-up structure, and a plurality of second openings are formed in the second insulation protective layer for exposing the second conductive pads, respectively.

The method can comprise forming a plurality of the openings and a corresponding plurality of the first metallic frames and semiconductor chips, in a manner that the first metallic frames are connected with each other and the semiconductor chips are received in the openings, respectively.

According to the present invention, a metallic frame is disposed around the periphery of a predefined opening region of a substrate on at least a surface thereof so as for an opening to be formed inside the metallic frame by continuous laser ablation, thereby ensuring accurate position and shape of the opening so as to allow a semiconductor chip to be precisely received at a predefined position of the opening. As such, the present invention eliminates the need of an opening with a larger size as in the prior art. Further, since the gap between the opening and the semiconductor chip is quite small, when a dielectric layer is used for filling the gap to secure the semiconductor chip in the opening, no recess is formed on the surface of the dielectric layer and the surface of the dielectric layer is quite uniform, thus increasing product reliability, simplifying fabrication processes and reducing fabrication cost.

BRIEF DESCRIPTION OF DRAWINGS

FIGS. 2A to 2E are cross-sectional views showing a packaging structure having an embedded semiconductor element and a method for fabricating the same according to the present invention, wherein FIGS. 2B' and 2B" are top views of FIG. 2B.

DETAILED DESCRIPTION OF PREFERRED EMBODIMENTS

The following illustrative embodiments are provided to illustrate the disclosure of the present invention, these and other advantages and effects can be apparent to those in the art after reading this specification.

Figure 1A:
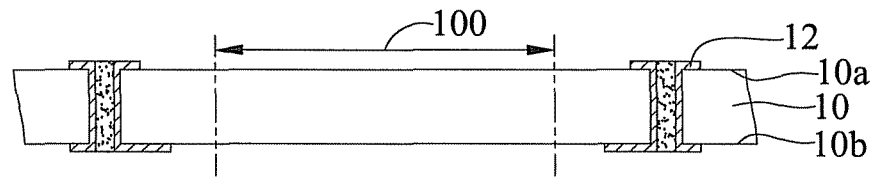
FIGS. 1A to 1C' are cross-sectional views showing a conventional packaging structure having an embedded semiconductor element and a method for fabricating the same, wherein FIG. 1B' is another embodiment of FIG. 1B, and FIG. 1C' shows the structure of FIG. 1B' after performing a sequence of subsequent processes thereon.
Figure 1B:
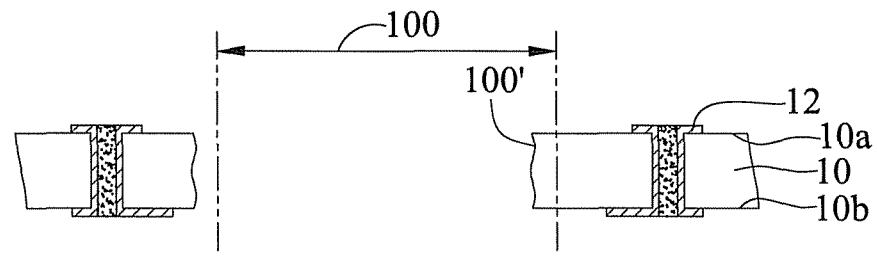
Figure 1B:
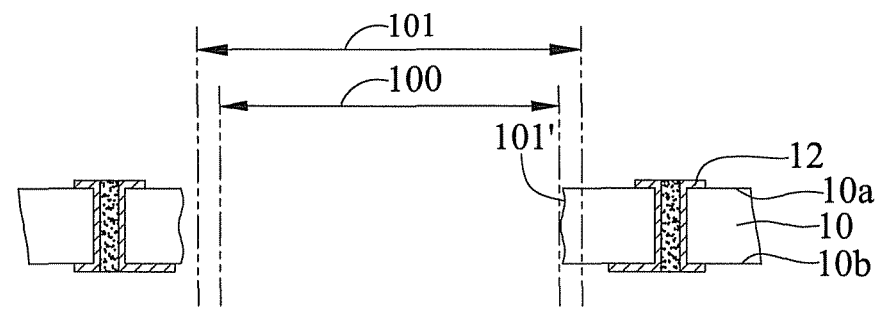
Figure 1C:
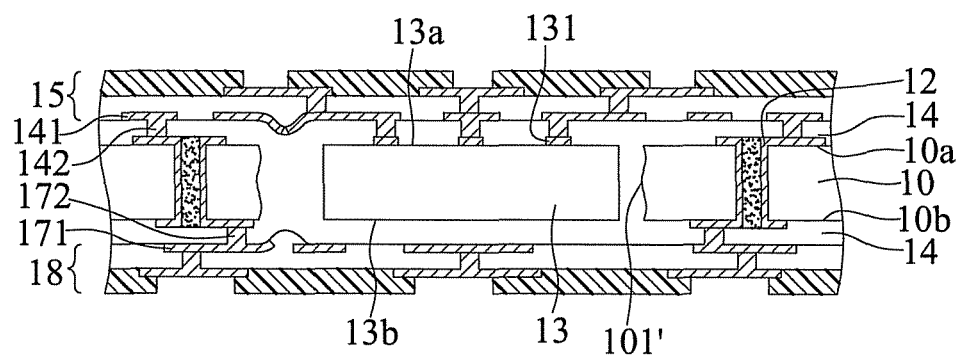
Figure 2C:
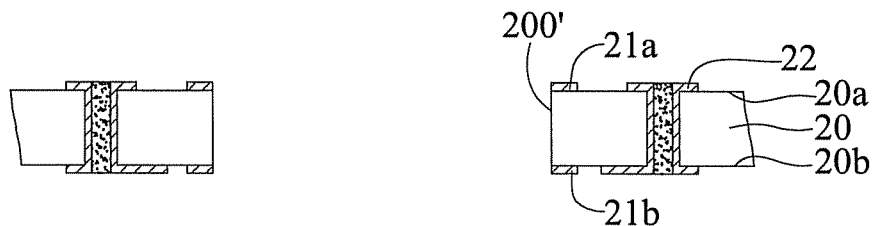

FIGS. 2A to 2E are cross-sectional views showing a packaging structure having an embedded semiconductor element and a method for fabricating the same according to the present invention, wherein FIGS. 2B' and 2B" are top views of FIG. 2B.

Referring to FIG. 2A, a substrate 20 having a first surface 20a and an opposite second surface 20b is provided.

Referring to FIG. 2B, at least an opening region 200 is predefined on the substrate 20; a first metallic frame 21a and a second metallic frame 21b are formed around the periphery of the predefined opening region 200 on the first surface 20a and the second surface 20b, respectively; and a plurality of conductive through holes 22 is formed in the substrate 20 and penetrates the first surface 20a and the second surface 20b. Preferably, the first metallic frame 21a and the second metallic frame 21b are made of copper. In other embodiments, the second metallic frame 21b can be omitted and only the first metallic frame 21a is formed on the first surface 20a of the substrate 20.

FIGS. 2B' and 2B" show different embodiments of FIG. 2B. Therein, FIG. 2B' shows a predefined opening region 200 and a first metallic frame 21a disposed around the periphery of the predefined opening region 200 on the first surface 20a. FIG. 2B" shows two opening regions 200, and two first metallic frames 21a connected with each other and disposed around the periphery of the two opening regions 200 on the first surface 20a so as for two semiconductor chips (not shown) to be respectively disposed within the two opening regions 200 in subsequent processes.

Referring to FIG. 2C, an opening 200' is formed by laser ablation at the position of the opening region 200, i.e., inside the first metallic frame 21a and the second metallic frame 21b, and the opening 200' is formed to penetrate the first surface 20a and the second surface 20b.

Figure 2D:
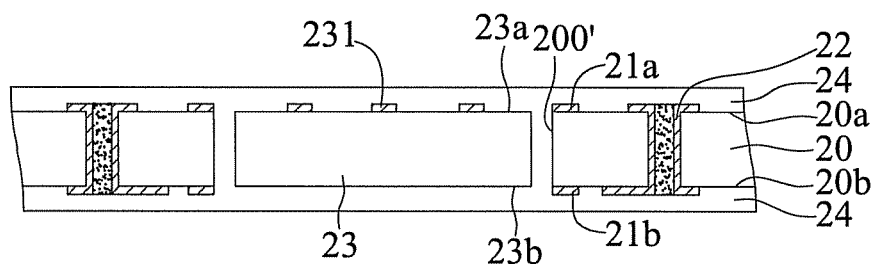

Referring to FIG. 2D, a semiconductor chip 23 having an active surface 23a with a plurality of electrode pads 231 and an opposite inactive surface 23b is received in the opening 200', the active surface 23a with the electrode pads 231 being exposed from the opening 200' through the first surface 20a. Then, two first dielectric layers 24 are respectively formed on the first surface 20a of the substrate 20 and the active surface 23a of the semiconductor chip 23, and on the second surface 20b of the substrate 20 and the inactive surface 23b of the semiconductor chip 23. The first dielectric layer 24 further fills the gap between the opening 200' and the semiconductor chip 23 so as to secure the semiconductor chip 23 in the opening 200'. In other embodiments, an adhesive material (not shown) can be filled in the gap between the opening 200' and the semiconductor chip 23 so as to secure in position the semiconductor chip 23 in the opening 200'.

Figure 2E:
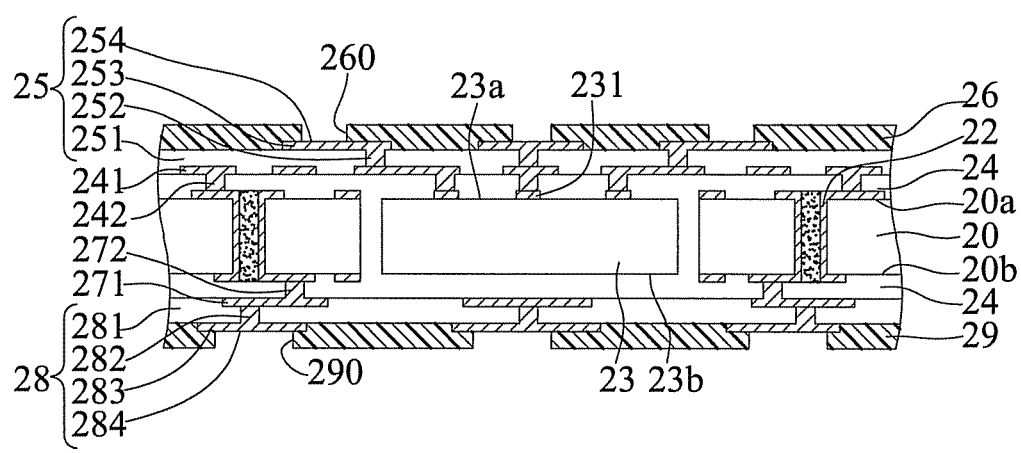

Referring to FIG. 2E, a first wiring layer 241 is formed on the first dielectric layer 24 on the first surface 20a and the active surface 23a, and a plurality of first conductive vias 242 are formed in the first dielectric layer 24 so as to electrically connect the first wiring layer 241, the conductive through holes 22 and the electrode pads 231. Then, a first built-up structure 25 is formed on the first dielectric layer 24 and the first wiring layer 241 of the first surface 20a. The first built-up structure 25 comprises at least a second dielectric layer 251, a second wiring layer 253 formed on the second dielectric layer 251, and a plurality of second conductive vias 252 formed in the second dielectric layer 251 for electrically connecting the first wiring layer 241 and the second wiring layer 253. The outermost second wiring layer 253 of the first built-up structure 25 has a plurality of first conductive pads 254. Further, a first insulation protective layer 26 is formed on the first built-up structure 25 and a plurality of first openings 260 are formed in the first insulation protective layer 26 for exposing the first conductive pads 254, respectively.

Referring to FIG. 2E, a third wiring layer 271 is formed on the first dielectric layer 24 on the second surface 20b and the inactive surface 23b, and a plurality of third conductive vias 272 are formed in the first dielectric layer 24 for electrically connecting the third wiring layer 271 and the conductive through holes 22. Then, a second built-up structure 28 is formed on the first dielectric layer 24 and the third wiring layer 271 of the second surface 20b. The second built-up structure 28 comprises at least a third dielectric layer 281, a fourth wiring layer 283 formed on the third dielectric layer 281, and a plurality of fourth conductive vias 282 formed in the third dielectric layer 281 for electrically connecting the fourth wiring layer 283 and the third wiring layer 271. The outermost fourth wiring layer 283 of the second built-up structure 28 has a plurality of second conductive pads 284. Further, a second insulation protective layer 29 is formed on the second built-up structure 28 and a plurality of second openings 290 are formed in the second insulation protective layer 29 for exposing the second conductive pads 284, respectively.

The present invention further provides a packaging structure having an embedded semiconductor chip, as shown in FIGS. 2D and 2E, which comprises: a substrate 20 having a first surface 20a and an opposite second surface 20b and at least an opening 200' penetrating the first surface 20a and the second surface 20b; a first metallic frame 21a disposed around the periphery of the opening 200, on the first surface 20a; and a semiconductor chip 23 received in the opening 200'.

The packaging structure further comprises a second metallic frame 21b disposed around the periphery of the opening 200' on the second surface 20b and a plurality of conductive through holes 22 penetrating the first surface 20a and the second surface 20b. Further, the semiconductor chip 23 has an active surface 23a with a plurality of electrode pads 231 and an opposite inactive surface 23b, and the electrode pads 231 is exposed from the opening 200' through the first surface 20a.

The packaging structure further comprises two first dielectric layers 24 respectively formed on the first surface 20a of the substrate 20 and the active surface 23a of the semiconductor chip 23, and on the second surface 20b of the substrate 20 and the inactive surface 23b of the semiconductor chip 23. The first dielectric layer 24 further fills the gap between the opening 200' and the semiconductor chip 23. A first wiring layer 241 is then formed on the first dielectric layer 24 on the first surface 20a and the active surface 23a and a plurality of conductive vias 242 are formed in the first dielectric layer 24 for electrically connecting the first wiring layer 241, the conductive through holes 22 and the electrode pads 231.

The packaging structure further comprises a first built-up structure 25 disposed on the first dielectric layer 24 and the first wiring layer 241 on the first surface 20a. The first built-up structure 25 comprises at least a second dielectric layer 251, a second wiring layer 253 formed on the second dielectric layer 251, and a plurality of second conductive vias 252 formed in the second dielectric layer 251 for electrically connecting the first wiring layer 241 and the second wiring layer 253. The outermost second wiring layer 253 of the first built-up structure 25 has a plurality of first conductive pads 254. Further, a first insulation protective layer 26 is formed on the first built-up structure 25 and has a plurality of first openings 260 formed therein for exposing the first conductive pads 254, respectively.

A third wiring layer 271 is further formed on the first dielectric layer 24 on the second surface 20b and the inactive surface 23b, and a plurality of third conductive vias 272 are formed in the first dielectric layer 24 for electrically connecting the third wiring layer 271 and the conductive through holes 22. The packaging structure further comprises a second built-up structure 28 disposed on the first dielectric layer 24 and the third wiring layer 271 on the second surface 20b. The second built-up structure 28 comprises at least a third dielectric layer 281, a fourth wiring layer 283 formed on the third dielectric layer 281, and a plurality of fourth conductive vias 282 formed in the third dielectric layer 281 for electrically connecting the fourth wiring layer 283 and the third wiring layer 271. The outermost fourth wiring layer 283 of the second built-up structure 28 has a plurality of second conductive pads 284. Further, a second insulation protective layer 29 is formed on the second built-up structure 28 and has a plurality of second openings 290 formed therein for exposing the second conductive pads 284, respectively.

The above-described structure may have a plurality of the openings 200' and a corresponding plurality of the first metallic frames 21a and semiconductor chips 23, such that the first metallic frames 21a are connected with each other and the semiconductor chips 23 are received in the openings 200', respectively.

According to the present invention, a metallic frame is disposed around the periphery of a predefined opening region of a substrate on at least a surface thereof so as for an opening to be formed inside the metallic frame by continuous laser ablation, thereby ensuring accurate position and shape of the opening for allowing a semiconductor chip to be precisely disposed to a predefined position of the opening. As such, the present invention eliminates the need of an opening with a larger size as in the prior art. Further, since the gap between the opening and the semiconductor chip is quite small, when a dielectric layer is used for filling the gap to secure the semiconductor chip in the opening, no recess is formed on the surface of the dielectric layer and the surface of the dielectric layer is quite uniform, thus increasing product reliability, simplifying fabrication processes and reducing fabrication cost.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating a packaging structure having an embedded semiconductor element, comprising the steps of:
providing a substrate having a first surface and an opposite second surface and at least an opening region predefined on the first surface;
forming a first metallic frame around a periphery of the predefined opening region on the first surface of the substrate;
forming an opening inside the first metallic frame by laser ablation, in a manner that the opening penetrates the first surface and the second surface of the substrate;
disposing a semiconductor chip in the opening, the semiconductor chip having an active surface with a plurality of electrode pads and an opposite inactive surface;
respectively forming a first dielectric layer on the first surface of the substrate and the active surface of the semiconductor chip and on the second surface of the substrate and the inactive surface of the semiconductor chip;
forming a first wiring layer on the first dielectric layer on the first surface of the substrate and the active surface of the semiconductor chip; and
forming a first built-up structure on the first dielectric layer and the first wiring layer on the first surface of the substrate.

2. The method of claim 1, further comprising forming a second metallic frame around the periphery of the predefined opening region on the second surface of the substrate.

3. The method of claim 1, wherein the first dielectric layer fills a gap between the opening and the semiconductor chip so as to secure the semiconductor chip in the opening.

4. The method of claim 1, further comprising forming at least a conductive through hole penetrating the first surface and the second surface.

5. The method of claim 4, further comprising forming a plurality of first conductive vias in the first dielectric layer for electrically connecting the first wiring layer, the conductive through hole and the electrode pads.

6. The method of claim 1, wherein the first built-up structure comprises at least a second dielectric layer, a second wiring layer formed on the second dielectric layer, and a plurality of second conductive vias formed in the second dielectric layer for electrically connecting the first wiring layer and the second wiring layer.

7. The method of claim 6, wherein the outermost second wiring layer of the first built-up structure has a plurality of first conductive pads, a first insulation protective layer is formed on the first built-up structure, and a plurality of first openings are formed in the first insulation protective layer for exposing the first conductive pads, respectively.

8. The method of claim 4, further comprising respectively forming a third wiring layer on the first dielectric layer on the second surface of the substrate and the inactive surface of the semiconductor chip, and forming a plurality of third conductive vias in the first dielectric layer for electrically connecting the third wiring layer and the conductive through hole.

9. The method of claim 8, further comprising forming a second built-up structure on the first dielectric layer and the third wiring layer on the second surface of the substrate, wherein the second built-up structure comprises at least a third dielectric layer, a fourth wiring layer formed on the third dielectric layer, and a plurality of fourth conductive vias formed in the third dielectric layer for electrically connecting the fourth wiring layer and the third wiring layer.

10. The method of claim 9, wherein the outermost fourth wiring layer of the second built-up structure has a plurality of second conductive pads, a second insulation protective layer is formed on the second built-up structure, and a plurality of second openings are formed in the second insulation protective layer for exposing the second conductive pads, respectively.

11. The method of claim 1, wherein a plurality of the openings and a corresponding plurality of the first metallic frames and semiconductor chips are formed, in a manner that the first metallic frames are connected with each other and the semiconductor chips are received in the openings, respectively.

\* \* \* \* \*